United States Patent [19]

Pierson

[11] Patent Number: 4,741,100

[45] Date of Patent: May 3, 1988

[54] PIN RETENTION METHOD AND APPARATUS

[75] Inventor: Mark V. Pierson, Binghamton, N.Y.

[73] Assignee: International Business Machines Corporation, Armonk, N.Y.

[21] Appl. No.: 911,186

[22] Filed: Sep. 24, 1986

[51] Int. Cl.$^4$ .................. H01R 9/16; B23P 19/00
[52] U.S. Cl. .................... 29/845; 29/739; 227/130
[58] Field of Search ............ 29/845, 844, 842, 843; 227/130

[56] References Cited

U.S. PATENT DOCUMENTS

| | | |
|---|---|---|
| 3,216,097 | 11/1965 | Stricker et al. |
| 3,257,708 | 6/1966 | Stricker ................ 29/845 |
| 3,484,937 | 12/1969 | Campbell, Jr. et al. ........... 29/845 |
| 3,566,464 | 3/1971 | Bakermans . |
| 3,803,694 | 4/1974 | Hermann et al. .............. 29/842 X |
| 3,829,949 | 8/1974 | Spencer ............. 29/845 X |
| 4,333,233 | 6/1982 | Dobson et al. ............. 29/842 X |
| 4,356,626 | 11/1982 | Waghorn ............... 29/747 |
| 4,415,113 | 11/1983 | Houser et al. .............. 227/130 |
| 4,550,493 | 11/1985 | Darrow et al. ............. 29/845 X |
| 4,631,821 | 12/1986 | Houser .................. 29/845 |

FOREIGN PATENT DOCUMENTS 891180 1/1972 Canada .
55811 7/1982 European Pat. Off. ........... 29/845

OTHER PUBLICATIONS

"Terminal Pin Projector"-H. P. Byrnes, IBM Tech. Disclosure Bulletin, vol. 9, No. 4, Sep. 1966, p. 365.
"Low-Stress Pin Insertion"-R. J. Modlo et al, IBM Tech. Disclosure Bulletin, vol. 22, No. 8B, Jan. 1980, p. 3649.
"Positive Contact-Compliant Stacking Intrinsic Pin Carrier Fixture"—R. Marks et al., IBM Technical Disclosure Bulletin, vol. 23, No. 11, April 1981, pp. 4840-4841.
"Tool For Use In Brazing I/O Pins"—W. R. Miller et al., IBM Technical Disclosure Bulletin, vol. 26, No. 7A, December 1983, pp. 3206-3207.
"Pin-Brazing Apparatus With Thermal Gas Pin-Preloading System"—W. B. Balder et al., IBM Technical Disclosure Bulletin, vol. 26, No. 8, January 1984, pp. 4339-4340.

Primary Examiner—Howard N. Goldberg
Assistant Examiner—Carl J. Arbes
Attorney, Agent, or Firm—Max J. Kenemore; Elmer W. Galbi; Norman R. Bardales

[57] ABSTRACT

A pin which has a compressive strength less than the tensile strength of a substrate can be fixed into a hole in the substrate when the substrate is held between a stopping block and a clamp by transporting the pin into the hole with sufficient kinetic energy that the pin is forged into a shape defined by the hole upon impacting the stopping block.

The pin can be retained in the substrate by forging it into a headed and bulged shape defined by recesses in the stopping block and the clamp on either side of the hole.

12 Claims, 3 Drawing Sheets

PIN RETENTION METHOD AND APPARATUS

FIELD OF THE INVENTION

This invention relates generally to the field of fixing pins in holes in a substrate and more particularly to retaining pins for electrical contact in a substrate for use as a computer component.

BACKGROUND OF THE INVENTION

In the construction of computers, computer chips are often mounted on substrates, such as ceramic substrates. The substrates are, in turn, plugged into a printed circuit board by means of pins which are fixed into holes in the substrate and normally extend at right angles to the plane of the substrate. The pins are plugged into sockets in the printed circuit board.

Printed circuit lines on the substrate connect the electrically conductive computer chip with the pins. The pins are normally made of a conductive material, as are the sockets on the printed circuit board. A printed circuit on the printed circuit board enables electrical communication between the computer chip and other components of the computer through this conductive path.

The fixing of pins in the substrate is an important aspect in the manufacture of the substrate. It is desirable in many computer applications to have the pins fixed or retained in the substrate by heading and bulging.

Heading and bulging is a cold forging technique in which a pin is first inserted through a hole in a substrate so that a short portion of the pin extends beyond one side of the substrate and a long portion of the pin is held in a fixture on the other side of the substrate. The short portion of the pin is impacted with a hammer mechanism. The impact causes the short portion of the pin to forge into a head shape, causes the portion of the pin in the hole to fill the hole, and causes a bulge to form in the long portion of the pin between the fixture and the substrate. The pin is retained in the substrate by the head and the bulge and by the tight fit of the pin in the hole.

Heading and bulge of the pin by impacted is widely used in the computer industry with success. However, there are accompanying problems and difficulties. The pin hammer mechanism is complex and requires high energy input. It often requires a great deal of energy to remove the long portions of the pins from the fixture after impacting.

An apparatus for automatically inserting electrical contacts into an electrical connector is described in U.S. Pat. No. 4,356,626 to Waghorn. Waghorn's apparatus uses air pressure to move contacts along a passageway and to insert the contacts in a connector where they are retained by press fit. Waghorn does not provide assistance in a search for an improved method for heading and bulging pins in a substrate.

Canadian Patent No. 891,180 to International Business Machines Corporation describes a method for making small through holes in a laminated circuit board by projecting a projectile through the board at high speed. This patent provides no assistance to one looking for an improved method for heading and bulging pins in a substrate.

SUMMARY OF THE INVENTION

It is an object of the present invention to overcome the disadvantages of the known methods of heading and bulging pins in a substrate.

It is also an object of this invention to simplify the method and apparatus for fixing and retaining pins in a substrate.

It is a further object of this invention to reduce the energy required to retain pins in a substrate by heading and bulging.

These and other objects are accomplished by the present invention which, in one aspect, is a method for retaining at least one pin in a substrate, the method comprising:
  (a) providing a substrate with at least one hole adapted for receiving the pin, the substrate having a tensile strength greater than the compressive strength of the pin;
  (b) holding the substrate between a stopping block and a clamp, both of which have a hardness greater than that of the pin, such that the hole is axially coextensive with a passage through the clamp, the passage being adapted for transport of the pin; and
  (c) moving the pin along a path defined by the passage and the hole such that the pin impacts the stopping block with sufficient kinetic energy that the pin is forged into a shape defined by the hole, whereby the pin is retained in the hole.

In another aspect of the present invention is an apparatus for retaining at least one pin in a substrate having a tensile strength greater than the compressive strength of the pin, the apparatus comprising:
  (a) a stopping block made from a material having a hardness greater than that of the pin;
  (b) a clamp made from a material having a hardness greater than that of the pin and adapted for holding the substrate against (a) such that a hole in the substrate for receiving the pin is axially aligned with a passage in the clamp, which passage is adapted for transport of the pin; and
  (c) a means for transporting the pin through the passage in (b) and through the hole in the substrate such that the pin impacts (a) with sufficient kinetic energy that the pin is forged into a shape defined by the hole,
whereby the pin is retained in the hole.

BRIEF DESCRIPTION OF THE DRAWINGS

The invention is described below with reference to the drawings which are intended to illuminate and exemplify the invention, but not be be exhaustive.

DESCRIPTION OF THE INVENTION

It has been discovered that a pin which has a compressive strength less than the tensile strength of a substrate can be fixed into a hole in the substrate when the substrate is held between a stopping block and a clamp, both of which are harder than the pin, by transporting the pin into the hole with sufficient kinetic energy that the pin is forged into a shape defined by the hole when it impacts the stopping block.

It has also been discovered that the pin can be retained in the substrate by forging it into a headed and bulged shape defined by recesses in the stopping block and the clamp on either side of the hole.

Figure 1:
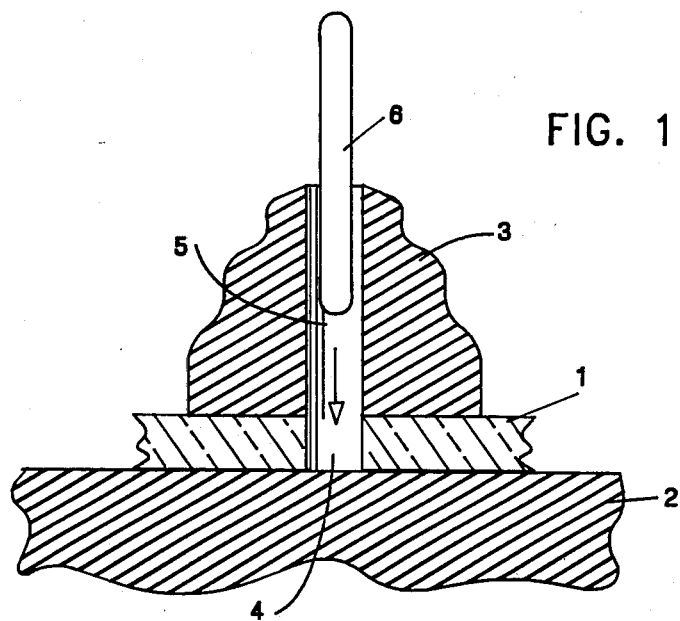
FIG. 1 shows a substrate held between a stopping block and a clamp.
Figure 2:
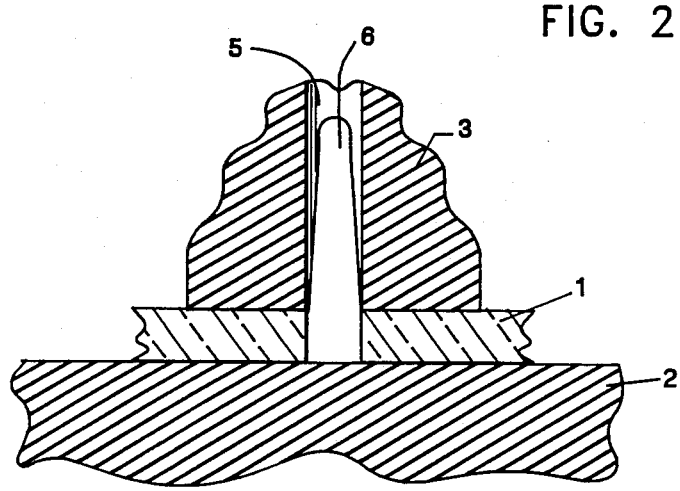
FIG. 2 shows a pin retained in the substrate of FIG. 1 by forging to fill the hole.

FIGS. 1 and 2 show a partial, cross-sectional view of substrate 1 held between stopping block 2 and clamp 3. Hole 4 in substrate 1 is aligned with passage 5 in clamp 3 so that their axes are coextensive. Pin 6 is transported along passageway 5 in the direction shown by the arrow.

Pin 6 is forged into a shape defined by hole 4 by impacting stopping block 2, as is shown in FIG. 2. The forged shape of pin 6 causes pin 6 to fit tightly in hole 4 so that it is retained therein.

The compressive strength of pin 6 must be less than the tensile strength of substrate 1 and the hardness of stopping block 2 and clamp 3 must be harder than that of pin 6 in order for the invention to be operative. Shattering of substrate 1 will result when the compressive strength of pin 6 is greater than the tensile strength of substrate 1. Forging of pin 6 will not occur to any useful degree if the hardness of stopping block 2 and clamp 1 are not greater than that of pin 6.

When using a ceramic material which has a tensile strength of about 55,000 pounds per square inch (psi) for substrate 1, good results will be obtained using a copper alloy material designated as Copper Development Association (CDA) No. C15000, having a compressive strength of 45,000 psi, for pin 6. Pin 6 made from such material will forge into the shape defined by hole 4 upon impact with stopping block 2 without shattering substrate 1.

Pin 6 made from CDA material No. C17200, a Beryllium copper allow, which has a compressive strength of 152,000 psi will shatter substrate 1 upon forging, as will a steel defined by American Society for Testing and Materials (ASTM) No. 4130 which has a compressive strength of 200,000 psi. However, ASTM material No. 2011, an aluminum alloy, will work in the present invention.

It is also important to the operation of the present invention that stopping block 2 and clamp 3 be made from materials which have a hardness greater than that of pin 6. In order to avoid gradual wearing away of stopping block 2 and clamp 3 during repeated operations in manufacturing it is preferred that these components be made from a material which is a great deal harder than pin 6. Good results will be obtained when stopping block 2 and clamp 3 are formed from a material such as hardened steel or carbide having a Rockwell hardness of from about 60 Rc to about 90 Rc.

The kinetic energy with which pin 6 impacts stopping block 2 is also important to the successful operation of the invention. The kinetic energy must be sufficient to cause forging of pin 6 at least over the thickness of substrate 1. The kinetic energy will vary from embodiment to embodiment and will depend upon such factors as the size of the pin and the compressive strength of the material from which the pin is made.

For example, when a 0.016 in. diameter pin having a length of 0.292 inch and a compressive strength of 45,000 psi is used, a kinetic energy of 0.0746 in. lb. will result in forging sufficient to fix the pin in a 0.018 in. diameter hole in a 0.040 in. thick substrate. Likewise, a pin of the same size, but having a compressive strength of about 10,000 psi. will be fixed in a similar hole by forging if it strikes stopping block 2 with a kinetic energy of 0.016 in. lbs.

Figure 3:
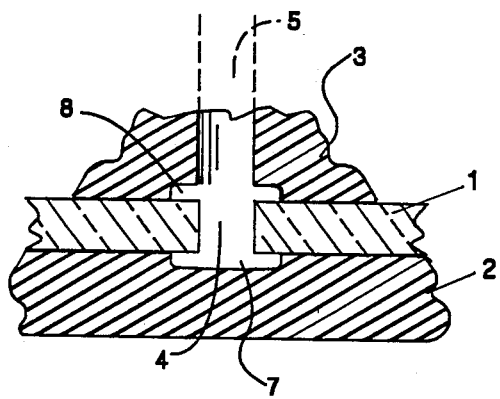
FIG. 3 shows a substrate held between shaped recesses in a stopping block and a clamp.
Figure 4:
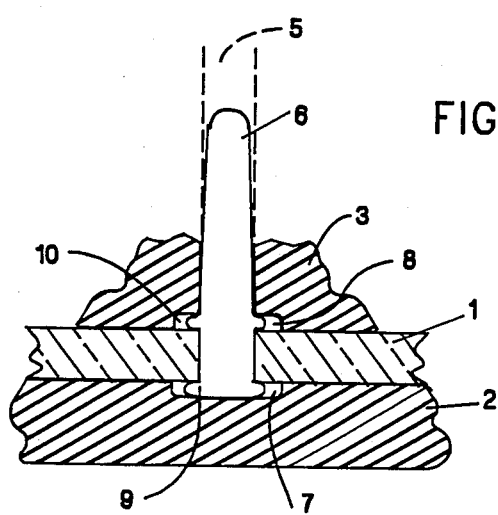
FIG. 4 shows a pin retained in the substrate of FIG. 3 by forging to achieve a headed and bulged shape.

FIGS. 3 and 4 show a preferred embodiment of the present invention wherein stopping block 2 and clamp 3 contain shaped recesses 7 and 8, respectively. substrate 1 is held between stopping block 2 and clamp 3 in this embodiment such that shaped recesses 7 and 8 are on either side of hole 4. Shaped recess 8 in clamp 3 opens into passage 5 for transporting pin 6.

FIG. 4 shows pin 6 after it has been forged by impacting stopping block 2. Head 9 and bulge 10 are formed in pin 6 by the forging action and by shaped recesses 7 and 8. Pin 6 is retained or fixed in substrate 1 by both the close fit caused when pin 6 is forged to fill hole 4 but also by head 9 and bulge 10.

The exact shape of shaped recesses 7 and 8 are not critical to the operation of the preferred embodiment of the invention. Preferred shapes can be calculated by one of ordinary skill in the pinning technology to achieve the head and bulge size desired. In one embodiment, for example, a shaped recess having a diameter of 0.026 in. to 0.028 in. and a height of about 0.012 is useful in both stopping block 2 and clamp 3 whenever a 0.020 in. diameter pin is used. When a 0.016 in. diameter pin is used, shaped recesses having diameters of 0.022 to 0.024 in. and a height of 0.008 in. will be useful.

Figure 5:
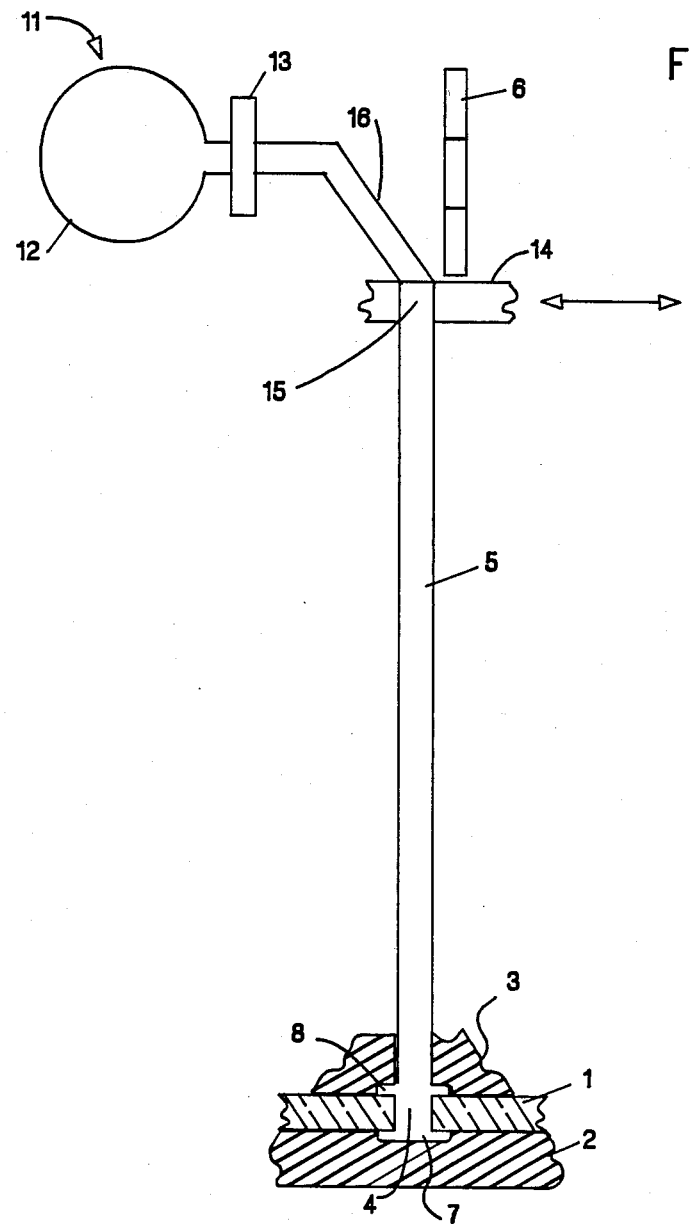
FIG. 5 shows an apparatus for transporting a pin in accordance with the method of the invention.

FIG. 5 shows an apparatus for carrying out the method of the present invention. The apparatus comprises a stopping block 2 and clamp 3 for holding substrate 1. Substrate 1 is held so that hole 4, which is adapted for receiving pin 6 is axially aligned with passage 5 for transporting pin 6 against stopping block 2.

Air pressure source 12 and valve 13 comprise means 11 for transporting pin 6 along passage 5 into contact with stopping block 2. Effective retention of pins 6 in substrate 1 will be obtained when 180 psi. air pressure is delivered by means 11 to propel copper pins 6 having a compressive strength of about 45,000 psi. and a length of 0.292 in. along a passage 5 for 24 inches to achieve a velocity in pin 6 of 386 miles per hour when pin 6 impacts stopping block 2. One of ordinary skill in the pinning art will readily understand that other pressures and velocities will be appropriate for other pin sizes and compressive strengths.

Any useful mechanism for loading pins 6 into passage 5 for transport to stopping block 2 can be used. Reciprocating slide 14 is shown in FIG. 5 as one useful mechanism for retrieving pins 6 from a supply stack and moving them individually into position for engagement with means 11. Slide 14 moves to the right to permit one pin 6 to drop into slot 15. Slide 14 them moves to the left so that pin 6 is aligned with passage 5 and air pressure supply 16 extending from means 11.

FIG. 5 shows shaped recesses 7 and 8 in stopping block 2 and clamp 3, respectively, as is more fully described in connection with FIGS. 3 and 4. However, the apparatus shown in FIG. 5 could be readily used in connection with the stopping block 2 and clamp 3 shown in FIGS. 1 and 2. One of ordinary skill in the pinning technology will also readily understand that a shaped recess could be used in only one of stopping block 2 or clamp 3 and that any useful means 11 will be effective in the present invention.

Clamp 3 and stopping block 2 are removed from contact with substrate 1 after pins 6 have been retained in substrate 1 by the method of the present invention.

Relatively easy removal of the substrate and retained pins from the clamp will be experienced by those practicing the invention. One of ordinary skill in the pinning technology will understand that the kinetic energy of the pin at the time of forging impact against stopping block 2 can be controlled to limit the amount of pin 6 which is forged so that pin 6 is not forged into contact with passage 5 to such an extent that removal is difficult.

The present invention has been disclosed in the above teachings and in the accompanying drawings with sufficient clarity and conciseness to enable one skilled in the art to make and to use the invention, to know the best mode for carrying out the invention, and to distinguish it from other inventions and from what is old. Many variations and obvious adaptions of the invention will readily come to mind and these are intended to be contained within the scope of the invention as claimed below.

What is claimed is:

1. A method for retaining at least one pin in a ceramic substrate comprising the steps of:
   (a) providing a ceramic substrate with at least one hole adapted for receiving the pin, the substrate having a tensile strength greater than the compressive strength of the pin, and the diameter of the hole being greater than the diameter of the pin;
   (b) holding the substrate between a stopping block and a clamp, both of which have a hardness greater than that of the pin, such that the hole is axially coextensive with a passage through the clamp, the passage being adapted for transport of the pin; and
   (c) moving the pin along a path defined by the passage and the hole such that the pin while moving impacts the stopping block with sufficient kinetic energy whereby the pin is cold forged with a shape within and defined by the hole, and whereby the pin is retained in the hole.

2. The method of claim 1 wherein in step (b) the substrate is held such that the hole is positioned between a shaped recess in the stopping block and a shaped recess in the clamp and wherein in step (c) the pin is further forged with a shape within and defined by the shaped recesses and the hole.

3. The method of claim 2 wherein the shaped recesses define the shape of the pin such that in step (c) a head is formed in the pin adjacent the substrate on the side of the substrate held by the stopping block and a bulge is formed in the pin adjacent the substrate on the side of the substrate held by the clamp.

4. The method of claim 1 wherein the pin comprises copper.

5. The method of claim 1 wherein said pin is along said path with a velocity sufficient to provide said kinetic energy when said pin impacts said block.

6. An apparatus for retaining at least one pin in a ceramic substrate having first and second planar surfaces and a tensile strength greater than the compressive strength of the pin, the substrate further having at least one hole for receiving said pin, the diameter of said hole being greater than the diameter of said pin, said hole extending through said substrate between said first and second surfaces, the apparatus comprising:
   (a) a stopping block adjacent said first surface;
   (b) a clamp adjacent said second surface and having a passage therethrough, said clamp being adapted for holding the substrate against said block such that the hole in the substrate is axially aligned with the passage in the clamp, which passage is adapted for transport of the pin therethrough; and
   (c) a means for transporting the pin through the passage in said clamp and from thence into and through the hole in the substrate such that the pin while moving impacts said block with sufficient kinetic energy whereby the pin is cold forged with a shape within and defined by the hole, and whereby the pin is retained in the hole.

7. The apparatus of claim 6 wherein said block and said clamp include shaped first and second recesses, respectively, said first recess being located in said block adjacent to said first surface and in axial alignment with the hole in the substrate, said second recess being located in said clamp and adjacent to said second surface and in axial alignment with said hole, whereby the pin is further forged with a shape defined by the shaped recesses and the hole.

8. The apparatus of claim 7 wherein the shaped first and second recesses in said block and said clamp, respectively, are shaped such that the pin is forged into a shape which includes a head adjacent the first surface of the substrate and a bulge adjacent the second surface of the substrate.

9. The apparatus of claim 8 wherein said means for transporting transports the pin by air pressure.

10. The apparatus of claim 6 wherein the pin comprises copper.

11. The apparatus of claim 6 wherein the substrate contains a plurality of holes for receiving a corresponding plurality of pins; said apparatus further comprising:
    a corresponding plurality of first recesses located in said stopping block and adjacent to said first surface, each of said first recesses being in axial alignment with one of said holes,
    said clamp having a corresponding plurality of passages therethrough, each of said passages being adapted to transport one of said pins, each of said holes being axially aligned with one of said passages when said substrate is being held by said clamp against said stopping block,
    a corresponding plurality of second recesses located in said clamp and adjacent with second surface, each of said second recesses being in axial alignment with one of said holes and the particular one of said passages axially aligned therewith when said substrate is being hole by said clamp against said block, and
    said means for transporting moving said pins through their respective passages and from thence into and through their respective one of their holes such that each of said pins while moving impacts said block with sufficient kinetic energy whereby each of said pins is forged with a shape defined by the hole and the first and second recesses aligned with the particular pins passage.

12. The apparatus of claim 6 wherein said means for transporting moves said pin through said passage and said hole with a velocity sufficient to provide said kinetic energy when said pin impacts said block.

* * * * *